United States Patent
Kahlman

(10) Patent No.: US 6,717,994 B1
(45) Date of Patent: Apr. 6, 2004

(54) APPARATUS FOR DECODING A SERIAL DATASTREAM OF CHANNEL WORDS INTO A DATASTREAM OF INFORMATION WORDS

(75) Inventor: Josephus Arnoldus Henricus Maria Kahlman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/564,616

(22) Filed: May 4, 2000

(30) Foreign Application Priority Data

May 12, 1999 (EP) .............................. 99201475

(51) Int. Cl.[7] .............................. H04L 27/06; H04L 7/00
(52) U.S. Cl. ........................................ 375/340; 375/366
(58) Field of Search ................................. 375/316, 340, 375/363–366; 370/510–514; 360/39, 55, 51

(56) References Cited

U.S. PATENT DOCUMENTS

| 5,477,222 A | 12/1995 | Kahlman et al. |
| 5,627,694 A | 5/1997 | Ido et al. .............. 360/51 |
| 6,522,831 B2 * | 2/2003 | Tanaka et al. ......... 386/116 |

FOREIGN PATENT DOCUMENTS

| EP | 0655850 A2 | 5/1995 | .......... H04L/25/49 |
| GB | 1540617 | 2/1979 | |

* cited by examiner

Primary Examiner—Tesfaldet Bocure
(74) Attorney, Agent, or Firm—Michael E. Belk

(57) ABSTRACT

The invention provides for an apparatus for decoding a serial datastream of channel words into a datastream of information words. The apparatus comprises an input terminal (10) for receiving the serial data stream of channel words, a serial-parallel converter unit (16) means for serial-to-parallel conversion of the serial datastream into a parallel datastream of n-bit intermediate channel words. Further, a clock signal generation unit (14) is present for deriving a first clock signal of a specific frequency from the serial datastream of channel words. A frequency division unit (18) is present for dividing the frequency of the clock signal generated by the generation means by a factor of n, so as to obtain a second clock signal of a reduced frequency. A sync word detection unit (24) is available for detecting sync words present in said serial datastream of channel words. Said sync word detection unit (24) is adapted to receive said n-bit intermediate channel words from said serial-parallel conversion unit (16) under the influence of said second clock signal and is further adapted to generate an offset control signal, said offset control signal being indicative of the relative offset, given in numbers of bits, between the start of a sync word and the location of this start position within an n-bit intermediate channel word. A converter unit (26,32) is present for converting said n-bit intermediate channel words into n-bit phase shifted channel words and for converting said phase shifted channel words into information words in response to said second clock signal and said offset signal.

3 Claims, 3 Drawing Sheets

Figure 1:
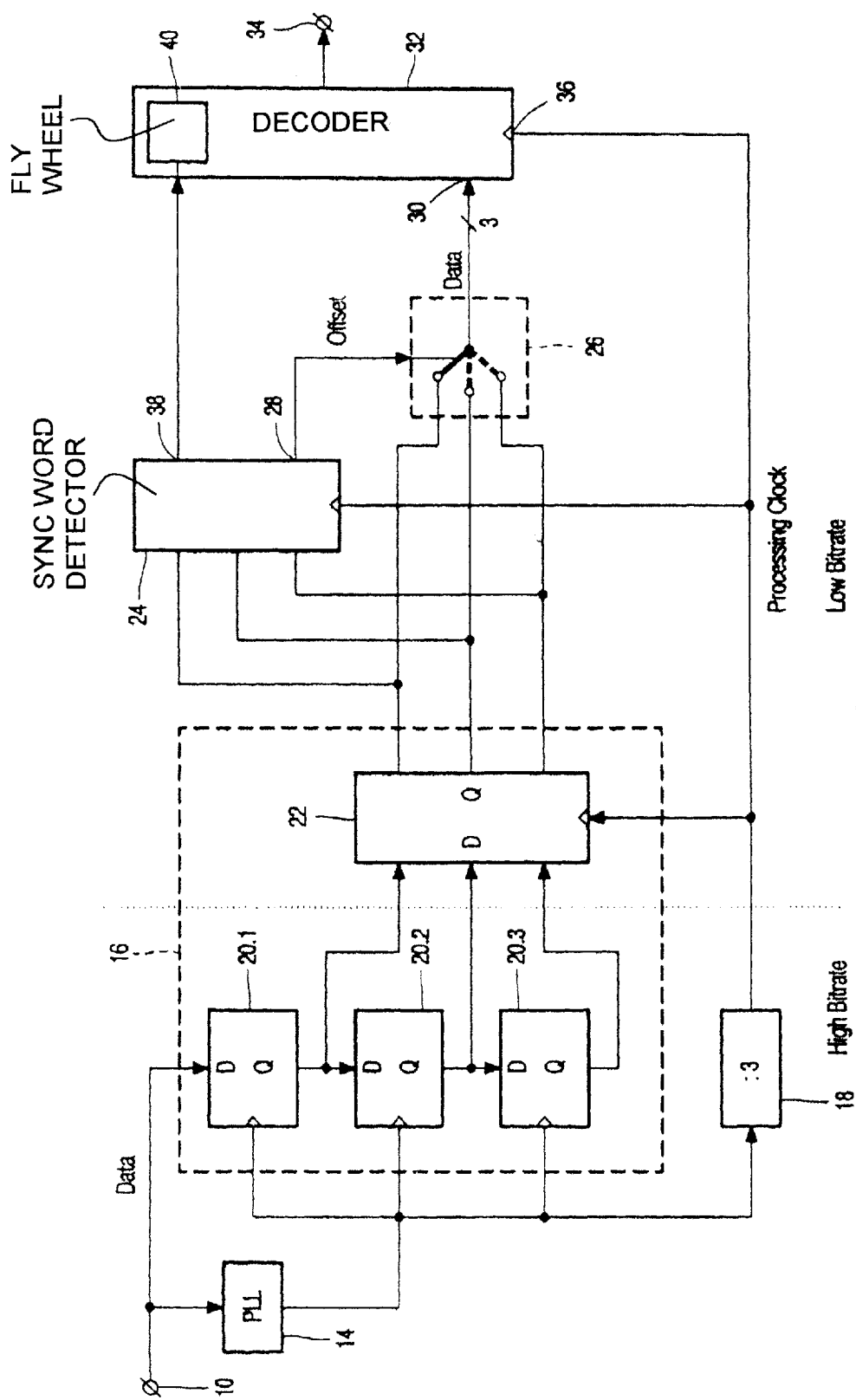

APPARATUS FOR DECODING A SERIAL DATASTREAM OF CHANNEL WORDS INTO A DATASTREAM OF INFORMATION WORDS

The invention relates to an apparatus for decoding a serial datastream of channel words into a datastream of information words. Such apparatus is well known in the art. Reference is made in this respect to U.S. Pat. No. 5,477,222 (PHN 14448).

The known apparatus requires a decoding processing speed in relation to the bitrate of the serial datastream received. Especially with increasing bitrates, this requires complex and expensive electronic circuitry.

The invention aims at providing an improved decoder apparatus which is capable of decoding serial datastreams of relatively high bitrates with a relatively simple electronic circuitry. The apparatus in accordance with the invention comprises an apparatus for decoding a serial datastream of channel words into a datastream of information words, the apparatus comprising input means for receiving the serial data stream of channel words, serial-parallel conversion means for serial-to-parallel conversion of the serial datastream into a parallel datastream of n-bit intermediate channel words, where n is a positive integer value, clock signal generation means for deriving a first clock signal of a specific frequency from the serial datastream of channel words, frequency division means for dividing the frequency of the clock signal generated by the generation means by a factor of n/a, so as to obtain a second clock signal of a reduced frequency, where a is a positive constant value, sync word detection means for detecting sync words present in said serial datastream of channel words, said sync word detection means being adapted to receive said n-bit intermediate channel words from said serial-parallel conversion means under the influence of said second clock signal, said sync word detection means further being adapted to generate an offset control signal, said offset control signal being indicative of the relative offset, given in numbers of bits, between the start of a sync word and the location of this start position within an n-bit intermediate channel word, converter means for converting said n-bit intermediate channel words into n-bit phase shifted channel words and for converting said phase shifted channel words into information words in response to said second clock signal and said offset signal.

The invention is based on the following recognition. Serial-to-parallel conversion results in accordance with the invention in a parallel datastream of n-bit intermediate channel words. When applying the decoding apparatus in accordance with the invention in the parity preserving decoding apparatus as described in U.S. Pat. No. 5,477,222, in which groups of 3-bit channel words are converted into groups of 2-bit information words, n could be chosen equal to 3. Further, by dividing the frequency of the first clock signal by n, the signal processing speed on the parallel datastream of n-bit channel words is lowered by a factor of n, so that less stringent requirements on the signal processing circuitry are required. A simple integration into an IC is possible. Further, a low power consumption is the result.

It is to be noted that GB 1,540,617 discloses a decoding apparatus provided with a serial-to-parallel converter and a frequency divider. However, the known decoder apparatus does not disclose a sync detector which functions in the reduced clock frequency domain.

Figure 2:
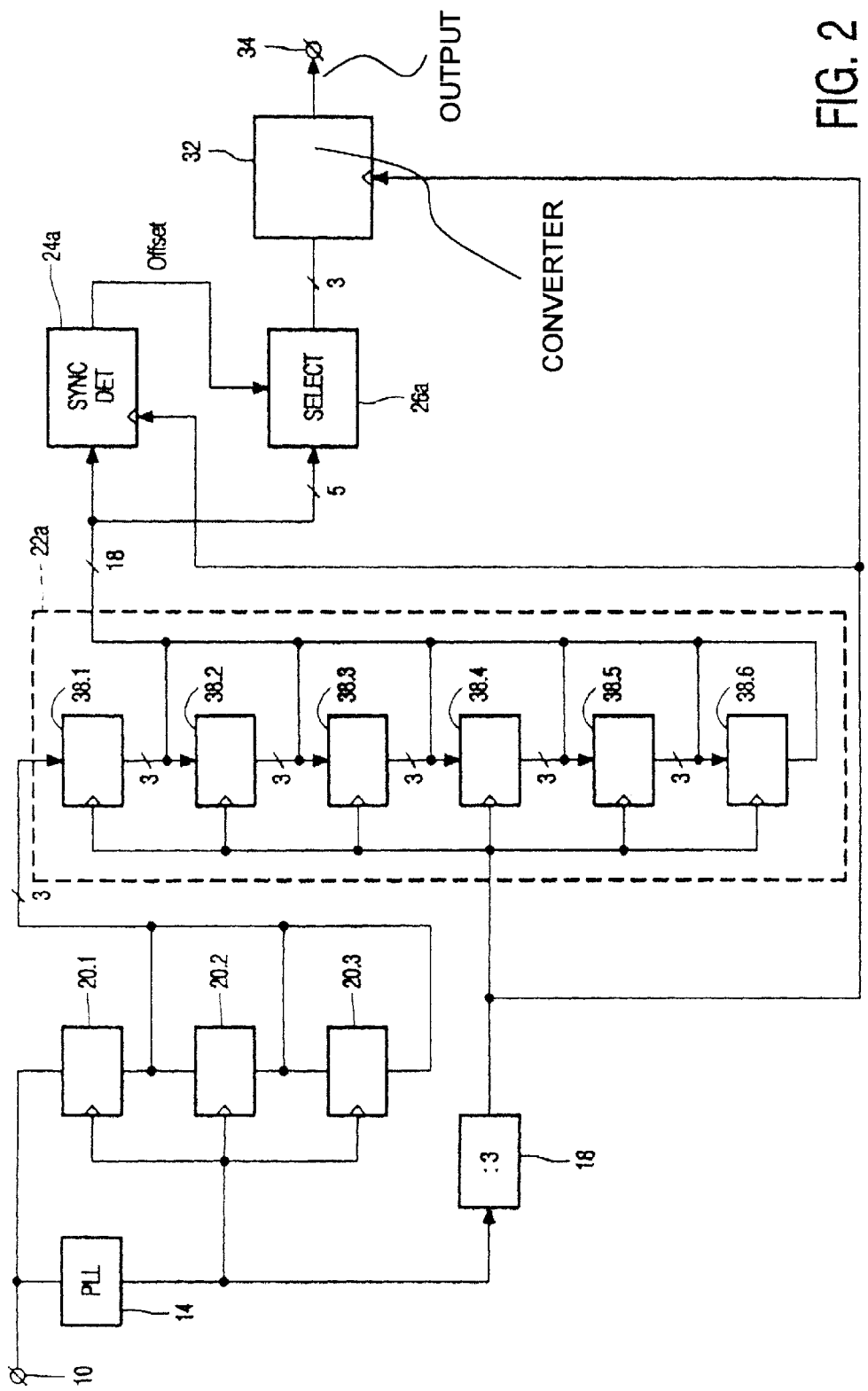
Figure 3:
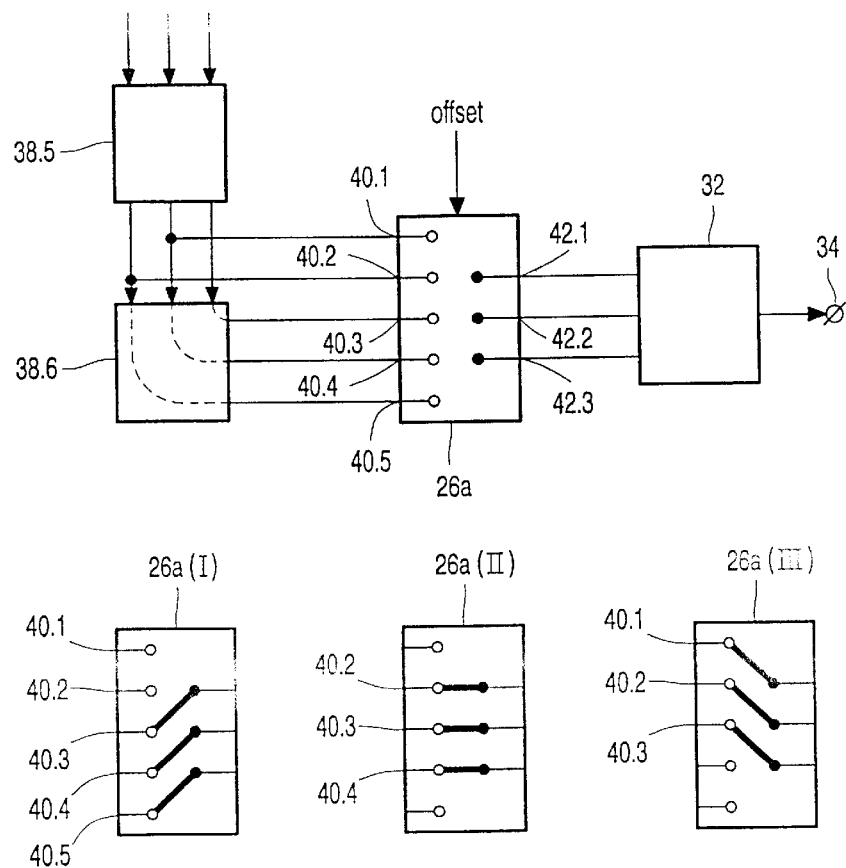
Figure 4:
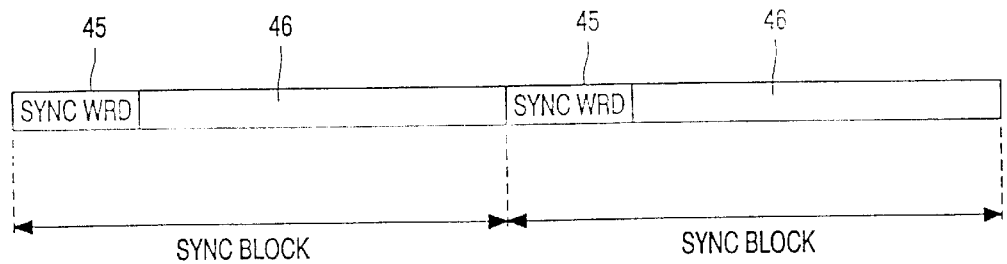

These and other aspects of the invention will become apparent in the following figure description, in which FIG. 1 shows a schematic embodiment of the decoding apparatus, FIG. 2 shows a second embodiment, FIG. 3 hows a detail of the selection circuit of FIG. 2, and FIG. 4 shows the serial datastream of the input signal for the apparatus.

FIG. 1 shows an embodiment of the decoding apparatus, having an input terminal 10 for receiving a serial datastream of channel words. The input terminal 10 is coupled to an input of a serial-to-parallel converter 16, as well as to an input of a clock signal generator circuit (PLL) 14. The clock signal generator circuit 14 is adapted to generate a first clock signal of a specific frequency from the serial datastream supplied to its input. The frequency generated may equal the channel clock frequency of the serial datastream of channel words, and is relatively high (e.g. 50 MHz). The serial-to-parallel converter 16 comprises n (which is in this example equal to 3) D flip flops 20.1, 20.2 and 20.3. The output of the generator circuit 14 is coupled to clock inputs of the three D flip flops and to an input of a frequency divider 18. The serial datastream is fed into the D flip flops of the serial-to-parallel converter 16 under the influence of the first clock signal. Outputs of the three D flip flops 20.1, 20.2 and 20.3 are coupled to respective inputs of a D flip flop 22.

The frequency divider 18 divides the frequency of the first clock signal by n, which is in the present example equal to 3, and supplies a second clock signal (processing clock) of a frequency which is divided by 3, compared to the specific frequency of the first clock signal, to its output. The D flip flop 22 receives a clock signal from the frequency divider 18, so that upon each time three clock pulses of the first clock signal, a 3-bit word is stored in the D flip flop 22 and thus a 3-bit wide intermediate channel word becomes available at the output of the serial-to-parallel converter 16. The serial-to-parallel conversion is carried out in an arbitrary way. That is: the serial-to-parallel conversion is carried out irrespective of the word synchronization in the serial datastream. It should be noted in this respect that, assuming that a bits per clock pulse of the first clock signal become available at the input 10, the frequency division in the divider should be carried out by a factor of n/a, in order to obtain the frequency of the second clock signal. As a result, a high processing clock frequency is present at the left-hand side of the vertical dotted line and a low processing clock frequency is present at the right-hand side thereof.

The 3 bit wide output of the serial-to-parallel converter 16 is coupled to a 3 bit wide input of a sync word detector 24, as well as to a selection unit 26, in the form of a switching unit. The serial datastream received via the terminal 10 comprises a sync word that occurs regularly, generally at equidistant positions, in the serial datastream. The sync word may be longer than n bits. If so, the sync detector 24 detects the sync words, by detecting sync words in a plurality of subsequent n-bit intermediate channel words, applied to the detector 24 by the serial-to-parallel converter 16. As soon as the detector 24 detects a sync word, it generates a detection signal at an output 38 and an offset signal at its output 28. The detection signal is supplied to a flywheel 40, well known in the art, included in a decoder unit 32 to be described later, and is used to synchronize the flywheel.

The offset control signal is indicative of the relative position of a sync word in relation to the word boundaries of the intermediate channel words. As an example, the beginning of a sync word can coincide with the boundary between two subsequent intermediate channel words. In this situation, the decoder apparatus is in phase with the incoming serial datastream and the intermediate channel words at the output of the flip flop 22 coincide with the actual channel words included in the incoming serial datastream. In another situation, an offset over one or two bit positions may occur between the position of the start of a sync word and the boundaries between the intermediate channel words. In this situation, the decoder apparatus is not in phase with the incoming serial datastream and a phase shift over one or two bit positions is present between the intermediate channel words and the actual channel words. This is reflected in the offset control signal.

An output of the unit 26, which is a 3-bit wide output, is coupled to a 3-bit wide input 30 of a decoder unit 32. The decoder unit 32 is meant to convert the actual 3-bit channel words that are included in the incoming serial datastream and are applied to its input 30. The unit 32 converts these 3-bit channel words into 2-bit information words and supplies the information words to an output 34.

In case of the decoder apparatus being in phase, the 3-bit intermediate channel words present at the output of the D flip flop 22 coincide with the actual channel words included in the incoming serial datastream. That means that the 3-bit intermediate channel words present at the three terminals of the unit 26 are the actual channel words included in the incoming serial datastream and can be supplied unmodified, and in response to the offset control signal, by the switch 26 to the 3-bit wide input 30 of the decoder 32.

In case of the decoder apparatus not being in phase, the 3-bit intermediate channel words could have a phase shift of one bit position with respect to the actual channel words included in the incoming serial datastream. That means that the 3-bit intermediate channel words present at the three terminals of the unit 26 are not the actual channel words included in the incoming serial datastream. In response to the offset control signal, the unit 26 now supplies the two bits present at the highest two input terminals to the decoder 32, and will upon the next clock pulse of the second clock signal supply the bit of the next intermediate channel word and present at the lowest of the three inputs to the decoder 32.

In another situation of the decoder apparatus not being in phase, the 3-bit intermediate channel words could have a phase shift over two bit positions with respect to the actual channel words included in the incoming serial datastream. That means that the 3-bit intermediate channel words present at the three terminals of the unit 26 are not the actual channel words included in the incoming serial datastream. In response to the offset control signal, the unit 26 will supply the bit present at the top input terminal to the decoder 32 and will upon the next clock pulse of the second clock signal, supply the two bits present at the two lowest terminals to the decoder 32.

A further elaborated embodiment of the invention is shown in FIG. 2. The embodiment of FIG. 2 shows some resemblance with the embodiment of FIG. 1. The D flip flop 22 of FIG. 1 has been replaced by the array 22a of six D flip flops 38.1 to 38.6, like the D flip flop 22. The flip flops are clocked by the second clock signal, so that, upon each clock pulse, 3-bit intermediate channel words are shifted into subsequent flip flops 38.1 to 38.6 of the array 22a of flip flops. The array comprises in this example 6 D flip flops. The outputs of all those flip flops (18 outputs in total in the present example) are coupled to the same number of inputs of the sync detector unit 24a. In this way, an 18-bit wide word can be supplied to the sync detector unit 24a. Only the five lowest bits of this 18-bit wide word are supplied to the selection unit 26a. The selection unit 26a has again three output terminals for supplying the phase shifted channel words to the converter unit 32.

The sync words included in the serial datastream supplied to the input terminal 10 are supposed to be 16 bits long. Upon a specific clock pulse of the second clock signal, the 16-bit sync word will be included in the 18-bit bit sequence supplied by the flip flops 38.1 to 38.6 to the sync word detector 24a. The 16-bit sync word can occur in three positions within the 18-bit bit sequence supplied to the detector 24a. The sync word detector 24a generates the offset signal in response to each one of those three positions, as the offset signal is an indication of the location of the start of the sync word with respect to the boundaries between the intermediate channel words, as explained above.

The phase shift on the basis of the offset control signal in the selection unit 26a is further explained with reference to FIG. 3. This figure shows the last two D flip flops 38.5 and 38.6 of the array 22a of FIG. 2. The three outputs of the flip flop 38.5 is coupled to the corresponding three inputs of the flip flop 38.6. Two of the outputs of the flip flop 38.5 are coupled to two inputs 40.1 and 40.2 of the selection unit 26a. The three outputs of the flip flop 38.6 are coupled to three other inputs 40.3 to 40.5 of the selection unit 26a. Three outputs 42.1 to 42.3 of the selection unit 26a are coupled to corresponding three inputs of the converter unit 32.

In case of the decoder apparatus being in phase, the 3-bit intermediate channel words present at the output of the D flip flop 38.6 coincide with the actual channel words included in the incoming serial datastream. That means that the 3-bit intermediate channel words present at the three terminals 40.3 to 40.5 of the unit 26a are the actual channel words included in the incoming serial datastream and can be supplied unmodified, and in response to the offset control signal, by the unit 26a to the 3-bit wide input of the decoder 32. The unit 26a(I) in FIG. 3 shows the position of three switches accommodated in the unit 26a to realize the unmodified transfer of those three bits of the intermediate channel word stored in the flip flop 38.6 to the converter 32.

In case of the decoder apparatus not being in phase, the 3-bit intermediate channel words could have a phase shift of one bit position with respect to the actual channel words included in the incoming serial datastream. That means that the 3-bit intermediate channel words present at the three terminals 40.2 to 40.4 of the unit 26a are the actual channel words included in the incoming serial datastream. In response to the offset control signal, the unit 26a now supplies the three bits present at the terminals 40.2 to 40.4 to the decoder 32. The unit 26a(II) in FIG. 3 shows the position of the three switches accommodated in the unit 26a to realize the transfer of the three bits present at the terminals 40.2 to 40.4 to the converter 32.

In another situation of the decoder apparatus not being in phase, the 3-bit intermediate channel words could have a phase shift over two bit positions with respect to the actual channel words included in the incoming serial datastream. That means that the 3-bit intermediate channel words present at the three terminals 40.1 to 40.3 of the unit 26a are the actual channel words included in the incoming serial datastream. In response to the offset control signal, the unit 26a will supply the bits present at those terminals to the decoder 32. The unit 26a(III) in FIG. 3 shows the position of the three switches accommodated in the unit 26a to realize the transfer of the three bits present at the terminals 40.1 to 40.3 to the converter 32.

It will be clear that in between two successive instants at which a sync word is detected by the detection unit 24a, the offset control signal maintains its value.

FIG. 4 shows the serial datastream supplied to the input terminal 10. The serial datastream comprises sync blocks of information, each sync block comprising a sync word 45, followed by a block of data 46. The blocks of data 46 comprise a plurality of n-bit channel words. Preferably, the length of the sync blocks, expressed in number of bits equals a multiplicity of n. This has the advantage that the offset control signal will have the same value upon each detection of a sync word.

Whilst the invention has been described with reference to preferred embodiments thereof, it is to be understood that these are not limitative examples. Thus, various modifications may become apparent to those skilled in the art, without departing from the scope of the invention, as defined by the claims. Further, any reference signs do not limit the scope of the claims. The invention, as far as incorporated in the reading apparatus, can be implemented by means of both hardware and software, and several "means" may be represented by the same item of hardware. The word 'comprising' does not exclude the presence of other elements or steps than those listed in a claim. Also, the word "a" or "an" preceding an element does not exclude the presence of a plurality of such elements. In addition, the invention lies in each and every novel feature or combination of features.

What is claimed is:

1. Apparatus for decoding a serial datastream of channel words into a datastream of information words, the apparatus comprising:

input means for receiving the serial data stream of channel words;

serial-parallel conversion means for serial-to-parallel conversion of the serial datastream into a parallel datastream of n-bit intermediate channel words, where n is a positive integer value;

clock signal generation means for deriving a first clock signal of a specific frequency from the serial datastream of channel words;

frequency division means for dividing the frequency of the clock signal generated by the generation means by a factor of n/a, so as to obtain a second clock signal of a reduced frequency, where a is a positive constant value;

sync word detection means for detecting sync words present in said serial datastream of channel words, said sync word detection means being adapted to receive said n-bit intermediate channel words from said serial-parallel conversion means under the influence of said second clock signal, said sync word detection means further being adapted to generate an offset control signal, said offset control signal being indicative of the relative offset, given in numbers of bits, between the start of a sync word and the location of this start position within an n-bit intermediate channel word; and converter means for converting said n-bit intermediate channel words into n-bit phase shifted channel words and for converting said phase shifted channel words into information words in response to said second clock signal and said offset signal.

2. Apparatus as claimed in claim 1, wherein said converter means include selection means having input terminals for receiving a plurality of bits of said n-bit intermediate channel words, a control signal input for receiving said offset control signal and an output for outputting said phase shifted n-bit channel words.

3. Apparatus as claimed in claim 2, wherein said selection means have 2n−1 input terminals for receiving 2n−1 subsequent bits of two subsequent n-bit intermediate channel words and n output terminals for supplying the n-bit phase shifted channel words.

* * * * *